United States Patent [19]
Sakemi et al.

[11] Patent Number: 5,516,032
[45] Date of Patent: May 14, 1996

[54] METHOD FOR FORMING BUMP ELECTRODE

[75] Inventors: Shoji Sakemi; Tadahiko Sakai, both of Fukuoka, Japan

[73] Assignee: Matsushita Electric Industrial Co., Ltd., Osaka, Japan

[21] Appl. No.: 341,057

[22] Filed: Nov. 16, 1994

[30] Foreign Application Priority Data

Nov. 17, 1993 [JP] Japan .................. 5-288022

[51] Int. Cl.$^6$ .............. B23K 1/00; B23K 3/00
[52] U.S. Cl. ............. 228/246; 228/254; 228/14; 228/56.3; 427/123
[58] Field of Search .................. 228/14, 41, 212, 228/245, 246, 254, 56.3; 427/123, 383.7, 405; 29/874, 879

[56] References Cited

U.S. PATENT DOCUMENTS 4,944,446  7/1990  Thompson .................. 228/245

FOREIGN PATENT DOCUMENTS 22162  2/1979  Japan .................. 228/14

OTHER PUBLICATIONS

IBM Technical Disclosure Bulletin, "Bench Brazer", vol. 30, No. 10, pp. 280–282, Mar. 1988.

Primary Examiner—Samuel M. Heinrich
Attorney, Agent, or Firm—Willian Brinks Hofer Gilson & Lione

[57] ABSTRACT

The invention relates to a method for forming bump electrodes on an electronic part such as a chip or a substrate. Conventional methods for forming bump electrode had a factor causing high cost, but with the invention, instead of solder balls, low cost solder wires are used, that is, solder wires are cut in a predetermined length, the cut solder wires are vacuum-attracted to the lower face of a pick up head and transferred onto a chip, then the solder pieces transferred are heated to melt, then cooled to solidify and results in forming bump electrodes of hemisphere shape.

9 Claims, 5 Drawing Sheets

PRIOR ART

5,516,032

METHOD FOR FORMING BUMP ELECTRODE

BACKGROUND OF THE INVENTION

1. Field of the Invention

The invention relates to a method for forming bump electrodes on the surface of an electronic part such as a chip or a substrate.

2. Description of the Prior Art

In order to make an electronic part such as a chip or a substrate smaller and more compact, methods for forming bump electrodes on patterning electrodes on the surface of a chip or a substrate are well known. Hereinafter, conventional methods for forming bump electrodes will be illustrated.

FIGS. 8(a), (b), (c) show the conventional method for forming bump electrodes. In FIG. 8(a), solder balls 1 are accommodated in a vessel 2, a pick up head 3 is provided with a plurality of holes 4 on the lower face thereof for vacuum-attracting the solder balls 1. By up and down motions above the vessel 2 of the pick up head 3 sucked the air therein in the direction shown with the broken arrow by a suction device (not shown), the solder balls are vacuum attracted at the holes 4 and picked up. Then, the pick up head 3 moves above a vessel (not shown) stored with flux, and again moves down and up to attach the flux to the lower faces of the solder balls 1.

Then, the pick up head 3 moves above a chip 5, and again moves down and up and release the vacuum attraction state of the solder balls 1 so as to transfer the solder balls 1 onto patterning electrodes formed on the surface of the chip 5. FIG. 8(b) is a perspective view of the chip with transferred solder balls 1. Then, the chip 5 is sent to a heating furnace of reflow type (not shown) and heated so that the solder balls are melted. After that, the solder balls are cooled and solidified by the air of ordinary temperature and results in bump electrodes of hemisphere shape as shown in FIG. 8(c). The chip 5 fabricated in this way is generally called Flip chip. Methods for forming bump electrodes utilizing solder balls may be applied to electronic parts such as IC packages and substrates. Said solder balls are generally made from solder plates, but the method is complicated and results in the problem of cost up of electronic parts like chips 5 made by utilizing solder balls 1. Other problem is that, the size of bump electrode have to be changed according to the kind of chips or substrates though, changing the size of bumps is difficult in said conventional methods.

SUMMARY OF THE INVENTION

An object of the invention is to provide a method for forming a bump electrode on an electronic part such as a chip or a substrate low costly and simply.

For this purpose, the method for forming bump electrode of the invention comprises the steps of: cutting solder wires at specific pitches; vacuum-attracting cut pieces of solder wires to the lower face of the pick up head and transferring them onto the upper face of an electronic part; and, heating the solder pieces to melt and then cooling them for solidifying. With above method, bump electrodes can be easily formed using low cost solder wires. Also, changing the diameter or cut pitch of the solder wires the dimension of the bump electrode can be easily changed.

DESCRIPTION OF THE PREFERRED EMBODIMENTS

Figure 1:
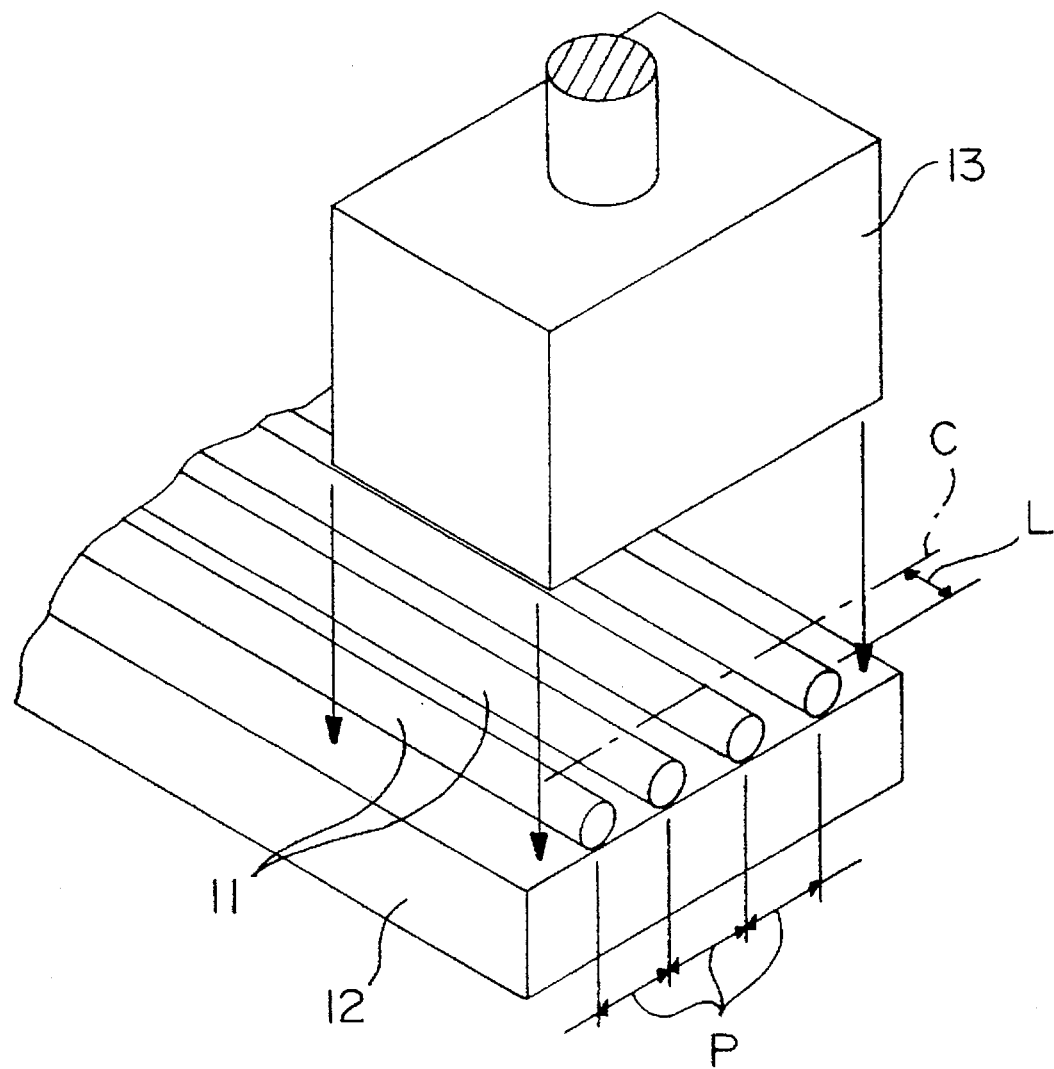
FIG. 1 is a perspective view of the step of pressing solder wires for illustrating the method for forming bump electrodes.
Figure 7:
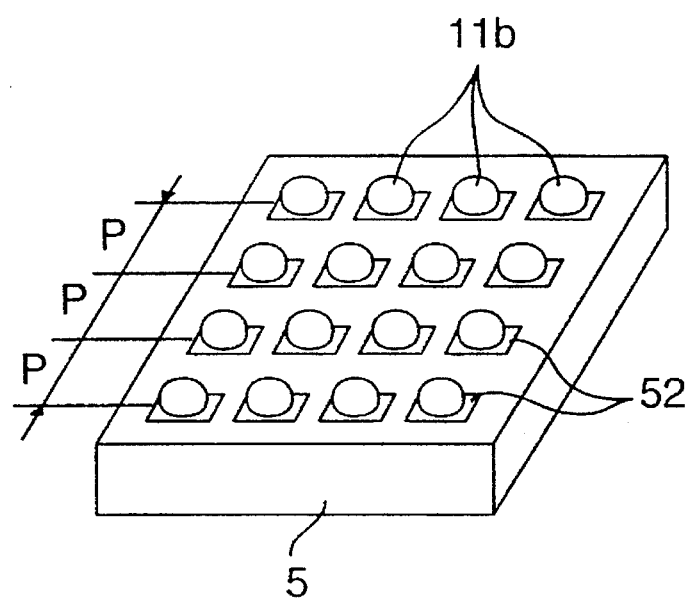
FIG. 7 is a perspective view showing the solder pieces treated by heat following the step of FIG. 6.
Figure 8A:
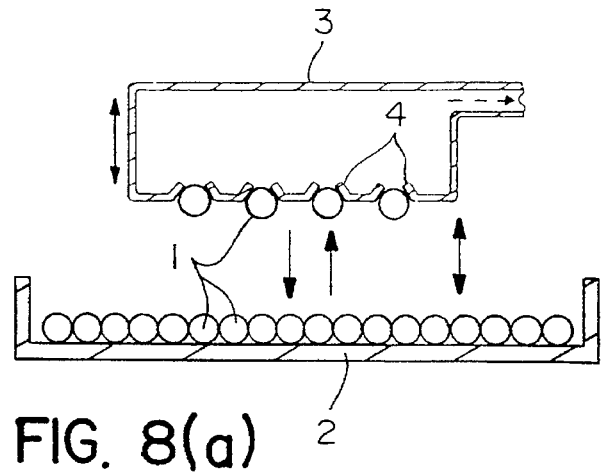
FIG. 8(a) is a sectional view showing a conventional method for forming bump electrode.
Figure 8B:
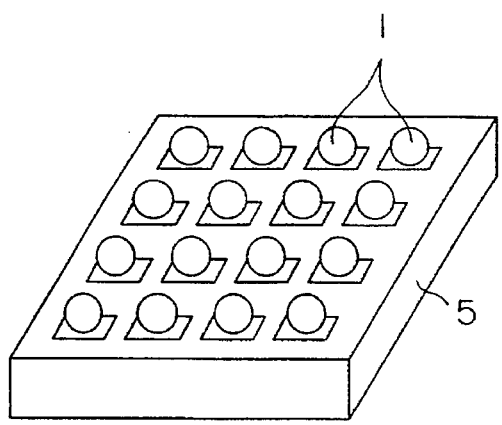
FIGS. 8(b), (c) are perspective views showing the steps of the conventional method for forming bump electrode following the step of (a).
Figure 8C:
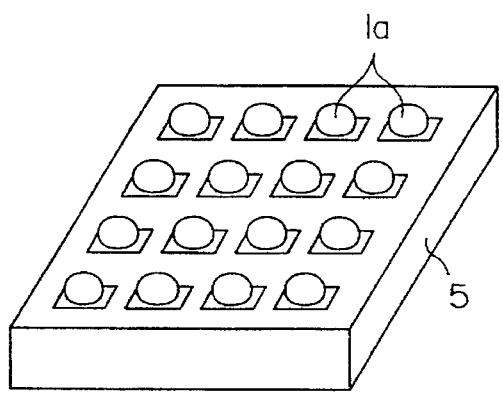

In FIG. 1, a plurality of solder wires 11 are parallelly spaced at pitches p on a base 12, the pitch is the same length as the pitch p of patterning electrodes 5a formed in a matrix on the upper surface of a chip 5 as shown in FIG. 7. The solder wires 11 are wound on spools (not shown) and fed by a feeding means not shown from the spools onto the base 12. The diameter of the solder wire of the embodiment was 0.3 mm though, of course, it can be determined arbitrarily. A press head 13 moves up and down by a driving means not shown to deform the solder wires 11 on the base 12 in a flat shape.

Figure 2:
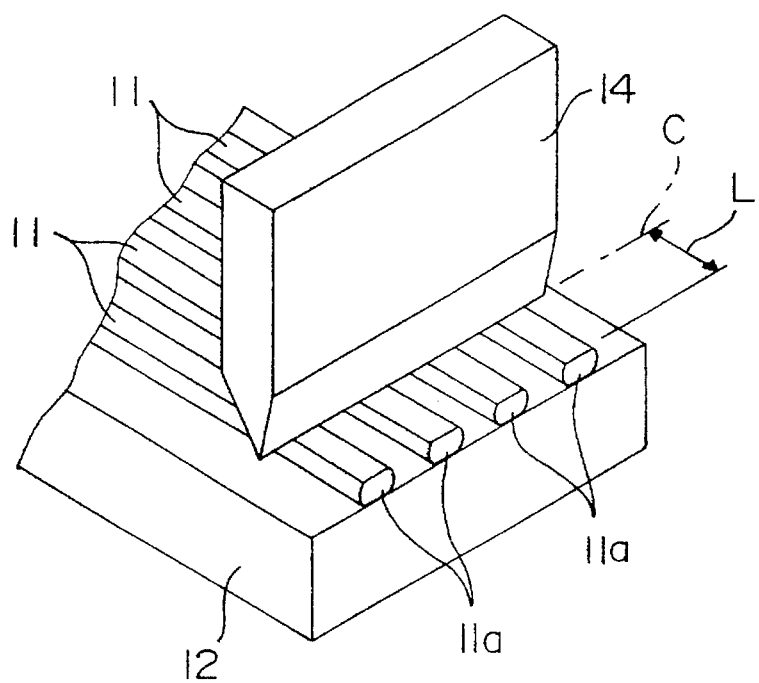
FIG. 2 is a perspective view of the step of cutting solder wires following the step of FIG. 1.

In FIG. 2, cutter 14 is driven to move up and down by a driving means not shown to cut solder wires 11 at the cut position C. the wires in FIG. 2 have been deformed in a flat shape by the press head 13 shown in FIG. 1.

Figure 3:
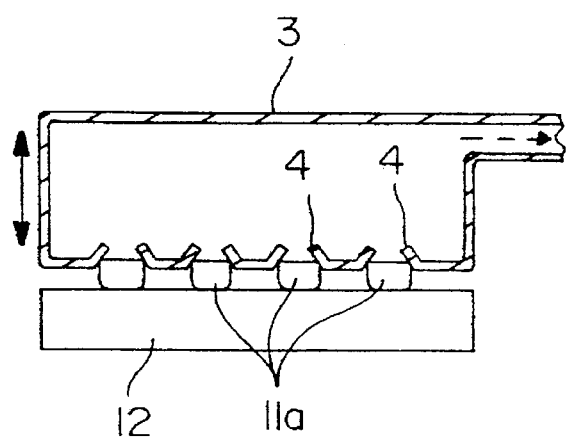
FIG. 3 is a sectional view of the step of picking up solder pieces following the step of FIG. 2.
Figure 4:
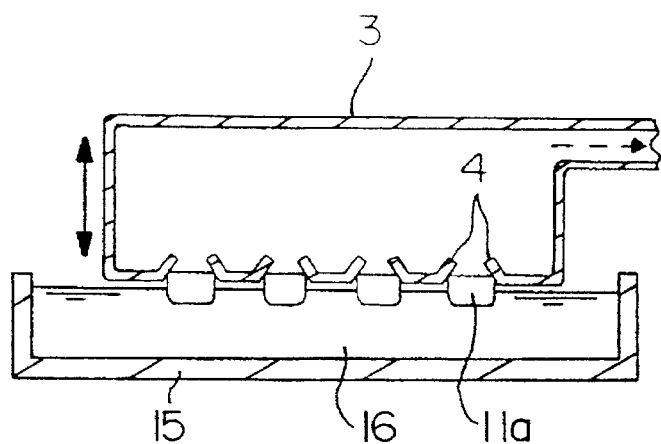
FIG. 4 is a sectional view of the step of solder dipping following the step of FIG. 3.

In FIG. 3, a pick up head 3 is the same as conventional ones, and provided with holes 4 for attraction. In FIG. 4, a vessel 15 is storing flux 16 therein.

Next, a method for forming bump electrode will be illustrated referring to FIG. 1–FIG. 7. First of all, a plurality of solder wires 11 spaced in a specific pitch p are fed onto the base 12 so that the ends of the solder wires are arranged on a line by a feeding means, L denotes the length between the ends of wires and cut position. Next, the solder wires are deformed in flat shapes by the press head 13, and cut at the cut position C to obtain solder pieces 11a of length L by the cutter 14. Next, as shown in FIG. 3, the pick up head 13 moves above the base 12 and moves down and up to pick up the cut solder pieces 11a at the holes 4 by vacuum attraction. The pitch of the plurality of the holes 4 is the same as that of solder wires 11 arranged on the base 12 so that a plurality of holes 4 can vacuum-attract the solder pieces respectively.

Figure 5:
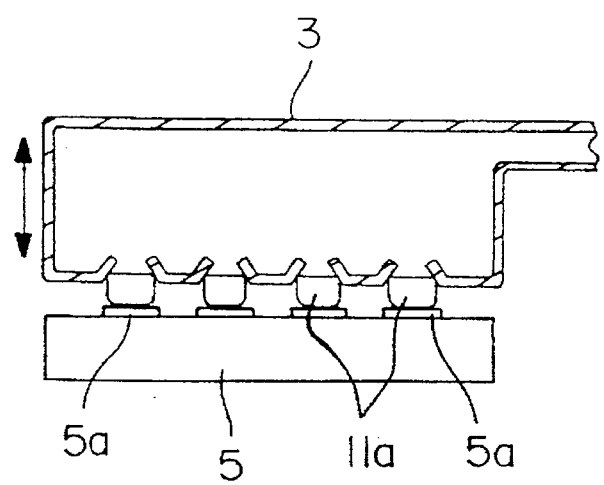
FIG. 5 is a sectional view of the step of mounting solder pieces following the step of FIG.4.

Next, as shown in FIG. 4, the pick up head 3 moves above a vessel (not shown) 15 and moves down and up to dip the solder pieces 11a to the flux 16 so as to attach the flux 16 to the lower faces of the solder pieces 11a. Then, as shown in FIG. 5, the pick up head 3 moves above the chip 5, and again moves down and up and release the vacuum attraction state so as to transfer the solder pieces 11a onto the patterning electrodes 5a on the surface of the chip 5.

Figure 6:
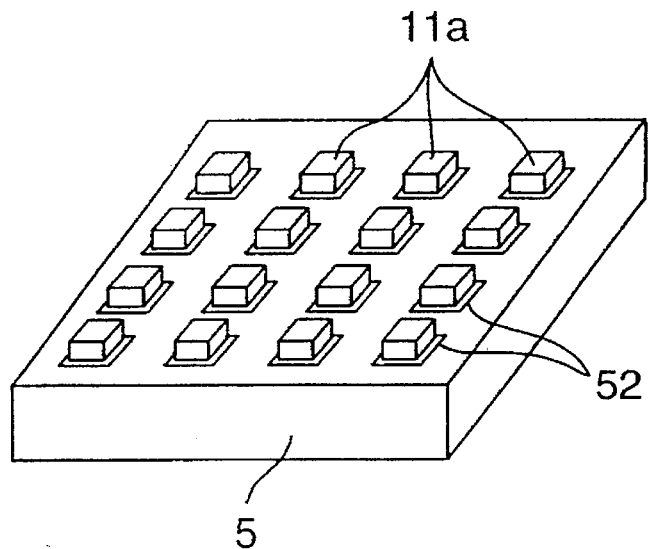
FIG. 6 is a perspective view showing the solder pieces mounted on a chip following the step of FIG. 5.

FIG. 6 is a perspective view of the chip 5 mounted with solder pieces 11a by above way. As shown, the solder pieces are transferred to form a matrix of 4 by 4 onto the chip 5, thus, the motions above are repeated four times for a chip 5. Then, the chip 5 is sent to a heating furnace of reflow type (not shown) and heated so that the solder pieces 11a are melted. After that, the solder balls are cooled and solidified by the air of ordinary temperature and results in forming bump electrodes 11b as shown in FIG. 7.

Since the wires are deformed in flat shapes by the press head 13 in the process shown in FIG. 1, the disadvantage that the solder pieces on the chip 5 tremble to slide while chip 5 is sent to the heating furnace and the like can be eliminated. Solder pieces 11a shown in FIG. 6 are of flat short wires, but after melted in the heat furnace, the melted solder pieces 11a change into hemisphere shapes due to its own surface tension as shown in FIG. 7, so, good shape bump electrodes 11b are obtained. Also, by changing diameter of the solder wire used or cut length L thereof cut by cutter 14, desired dimension of the bump electrode 11b can be formed. The length L is changed by controlling feed length of the solder wires 11 by a feeding means.

The invention is not intended to be limited to the embodiments above, the process of making solder wires flat, for example, may be performed at the same time as cutting process, or after cutting process. Solder wires formed beforehand into flat by other means can be also used. Also, as long as there is a means for preventing the solder pieces 11a from sliding, such as forming slots or ribs on the base 12 as shown in FIG. 1 or treating carefully the chip 5 mounted with solder pieces 11a, solder wires 11 is not always necessary to be flat. In the embodiments, the bump electrodes were formed on a chip, but bump electrodes may be formed on IC packages or substrates. In the embodiments, the case of the bump electrodes of the matrix of 4 by 4 was illustrated though, the method can be applied for forming bump electrode of a matrix of m×n (m, n are arbitrary integer of more than 0). In the embodiments, by forming four bump electrodes at one time and repeating this process four times, bump electrode of a matrix of 4×4 were formed though, it is needless to say that the method can be applied for forming bump electrode of a matrix of m×n at one time. For this purpose, holes 4 of a matrix of m×n are provided on the lower face of the pick up head 3 to pick up the solder pieces at the all of holes. As described above, according to the method for forming bump electrodes of the invention, bump electrodes can be easily and simply formed on an electronic part such as a chip or a substrate using low price solder wires. Dimension of the bump electrode can be easily changed through changing diameter or cut length of solder wires.

What is claimed is:

1. A method for forming a bump electrode comprising the steps of:

cutting a solder wire at a predetermined position from the end thereof to obtain a solder piece;

attracting said solder piece by a pick up head and transferring said solder piece onto a patterning electrode formed at a specific surface on an electronic part;

heating the solder piece transferred onto said electrode to melt; and, cooling the solder piece heated to solidify.

2. A method for forming a bump electrode comprising the steps of:

deforming specific portion of a solder wire into a flat shape;

cutting the solder wire of flat shape at a predetermined position from the end thereof to obtain a solder piece;

attracting said solder piece by a pick up head and transferring said solder piece onto a patterning electrode formed at a specific surface on an electronic part;

heating the solder piece transferred onto said electrode to melt; and, cooling the solder piece heated to solidify.

3. A method for forming a bump electrode comprising the steps of:

deforming specific portion of a solder wire into a flat shape and at the same time cutting the solder wire at a predetermined position from the end thereof to obtain a solder piece;

attracting said solder piece by a pick up head and transferring said solder piece onto a patterning electrode formed at a specific surface on an electronic part;

heating the solder piece transferred onto said electrode to melt; and, cooling the solder piece heated solidify.

4. A method for forming a bump electrode comprising the steps of:

cutting a solder wire at a predetermined position from the end thereof to obtain a solder piece;

deforming said solder piece into a flat shape;

attracting said flat solder piece by a pick up head and transferring said solder piece onto a patterning electrode formed at a specific surface on an electronic part;

heating the solder piece transferred onto said electrode to melt; and, cooling the solder piece heated to solidify.

5. A method for forming bump electrodes comprising the steps of:

arranging a plurality of solder wires parallelly at predetermined pitches and cutting the solder wires at a predetermined position from each of the ends thereof to obtain a plurality of solder pieces;

attracting said plurality of solder pieces by a pick up head and transferring said plurality of solder pieces onto a plurality of patterning electrodes formed at specific pitches on a specific surface on an electronic part;

heating the plurality of solder pieces transferred respectively onto said plurality of electrodes to melt; and, cooling the plurality of solder pieces heated to solidify.

6. A method for forming bump electrodes comprising the steps of:

arranging a plurality of solder wires parallelly at predetermined pitches and deforming the portion of said plurality of wires from each of the ends to a predetermined position thereof into flat shapes;

cutting the solder wires at a predetermined position from the each of ends thereof to obtain a plurality of solder pieces;

attracting said plurality of solder pieces by a pick up head and transferring said plurality of solder pieces onto a plurality of patterning electrodes formed at specific pitches on a specific surface on an electronic part;

heating the plurality of solder pieces transferred respectively onto said plurality of electrodes to melt; and, cooling the plurality of solder pieces heated to solidify.

7. A method for forming bump electrodes comprising the steps of:

arranging a plurality of solder wires parallelly at predetermined pitches;

deforming the portion of said plurality of wires from each of the ends to a predetermined position thereof into flat shapes and at the same time, cutting the solder wires at a predetermined position from the each of ends thereof to obtain a plurality of solder pieces;

attracting said plurality of solder pieces by a pick up head and transferring said plurality of solder pieces onto a plurality of patterning electrodes formed at specific pitches on a specific surface on an electronic part;

heating the plurality of solder pieces transferred onto said plurality of electrodes to melt; and, cooling the plurality of solder pieces heated to solidify.

8. A method for forming bump electrodes comprising the steps of:

arranging a plurality of solder wires parallelly at predetermined pitches;

cutting the solder wires at a predetermined position from each of the ends thereof to obtain a plurality of solder pieces;

deforming the plurality of solder pieces in flat shapes;

attracting said plurality of solder pieces by a pick up head and transferring said plurality of solder pieces onto a plurality of patterning electrodes formed at specific pitches on a specific surface on an electronic part;

heating the plurality of solder pieces transferred onto said plurality of electrodes to melt; and, cooling the plurality of solder pieces heated to solidify.

9. A method for forming bump electrodes comprising the steps of:

arranging a plurality of solder wires parallelly at predetermined pitches;

cutting the solder wires at a predetermined position from each of the ends thereof to obtain a plurality of solder pieces;

attracting said plurality of solder pieces by a pick up head and transferring said plurality of solder pieces onto a plurality of patterning electrodes formed in a matrix at specific pitches on a specific surface on an electronic part;

heating the plurality of solder pieces transferred onto said plurality of electrodes of the matrix to melt; and, cooling the plurality of solder pieces heated to solidify.

* * * * *